US011835815B2

(12) United States Patent
Nojima et al.

(10) Patent No.: US 11,835,815 B2
(45) Date of Patent: Dec. 5, 2023

(54) QUANTUM DOT, QUANTUM DOT COMPOSITION, WAVELENGTH CONVERSION MATERIAL, WAVELENGTH CONVERSION FILM, BACKLIGHT UNIT AND IMAGE DISPLAY DEVICE

(71) Applicant: SHIN-ETSU CHEMICAL CO., LTD., Tokyo (JP)

(72) Inventors: Yoshihiro Nojima, Annaka (JP); Shinji Aoki, Annaka (JP); Kazuya Tobishima, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 54 days.

(21) Appl. No.: 17/610,312

(22) PCT Filed: Apr. 17, 2020

(86) PCT No.: PCT/JP2020/016808
§ 371 (c)(1),
(2) Date: Nov. 10, 2021

(87) PCT Pub. No.: WO2020/241112
PCT Pub. Date: Dec. 3, 2020

(65) Prior Publication Data
US 2022/0228056 A1 Jul. 21, 2022

(30) Foreign Application Priority Data

May 27, 2019 (JP) .................................. 2019-098395

(51) Int. Cl.
| G02F 1/13357 | (2006.01) |
| C09K 11/02 | (2006.01) |
| G02B 5/20 | (2006.01) |
| H01L 33/50 | (2010.01) |
| B82Y 20/00 | (2011.01) |
| B82Y 30/00 | (2011.01) |
| B82Y 40/00 | (2011.01) |
| G02F 1/1335 | (2006.01) |

(52) U.S. Cl.
CPC ...... *G02F 1/133602* (2013.01); *C09K 11/025* (2013.01); *G02B 5/20* (2013.01); *H01L 33/502* (2013.01); *H01L 33/505* (2013.01); B82Y 20/00 (2013.01); B82Y 30/00 (2013.01); B82Y 40/00 (2013.01); G02B 5/207 (2013.01); G02B 2207/101 (2013.01); *G02F 1/133614* (2021.01)

(58) Field of Classification Search
CPC ....... C09K 11/025; B82Y 20/00; B82Y 40/00; G02B 5/207; G02F 1/133614; H01L 33/502; H01L 33/505
See application file for complete search history.

(56) References Cited

U.S. PATENT DOCUMENTS

| 2010/0167011 | A1 | 7/2010 | Dubrow | |
| 2012/0301971 | A1 | 11/2012 | Murase et al. | |
| 2014/0027711 | A1* | 1/2014 | Breen | C09K 11/06 428/407 |
| 2015/0329770 | A1 | 11/2015 | Kaneyoshi et al. | |
| 2016/0161065 | A1 | 6/2016 | Sung et al. | |
| 2016/0327690 | A1 | 11/2016 | Tokinoya et al. | |
| 2017/0198149 | A1 | 7/2017 | Yamada et al. | |
| 2017/0320306 | A1 | 11/2017 | Iwase | |
| 2018/0208835 | A1* | 7/2018 | Armstrong | B32B 7/12 |
| 2019/0336492 | A1 | 11/2019 | Peled et al. | |
| 2019/0345378 | A1 | 11/2019 | Armstrong et al. | |
| 2019/0359883 | A1 | 11/2019 | Armstrong et al. | |

FOREIGN PATENT DOCUMENTS

| CN | 106195921 | A | 12/2016 |
| CN | 106716189 | A | 5/2017 |
| CN | 107922832 | A | 4/2018 |
| CN | 108388080 | A | 8/2018 |
| CN | 108699433 | A | 10/2018 |
| CN | 108884385 | A | 11/2018 |
| EP | 1431352 | * | 4/2008 |
| JP | 2004-303592 | A | 10/2004 |
| JP | 2010-124553 | A | 6/2010 |
| JP | 2013-544018 | A | 12/2013 |
| JP | 5900720 | B1 | 4/2016 |
| JP | 2016-141050 | A | 8/2016 |
| JP | 2018-109141 | A | 7/2018 |
| JP | 2018-124553 | A | 8/2018 |
| JP | 2018-528302 | A | 9/2018 |
| JP | 2019-113765 | A | 7/2019 |
| JP | 2020-066727 | A | 4/2020 |
| KR | 2015-0041477 | * | 4/2015 |
| TW | 201433832 | A | 9/2014 |
| WO | 2011/081037 | A1 | 7/2011 |

(Continued)

OTHER PUBLICATIONS

May 24, 2022 Office Action issued in Japanese Patent Application No. 2019-098395.
Nov. 22, 2022 Office Action issued in Japanese Patent Application No. 2019-098395.
Jun. 23, 2020 International Search Report issued in International Application No. PCT/JP2020/016808.
Nov. 16, 2021 International Preliminary Report on Patentability issued in International Application No. PCT/JP2020/016808.
May 25, 2023 Office Action issued in Chinese Patent Application No. 202080038558.2.

*Primary Examiner* — C Melissa Koslow
(74) *Attorney, Agent, or Firm* — Oliff PLC

(57) ABSTRACT

A quantum dot including fluorescent crystalline nanoparticle, wherein surface of the quantum dot is modified with a ligand containing fluorine. The quantum dots include fluorescent crystalline nanoparticles which have high stability and are less likely to agglomerate when added to a fluororesin.

16 Claims, No Drawings

(56) References Cited

FOREIGN PATENT DOCUMENTS

| WO | 2012/134629 A1 | 10/2012 |
| WO | 2014/103932 A1 | 7/2014 |
| WO | 2014129067 A1 | 8/2014 |
| WO | 2017/103932 A1 | 6/2017 |
| WO | 2017/142782 A1 | 8/2017 |
| WO | 2017/172462 A1 | 10/2017 |
| WO | 2018/110406 A1 | 6/2018 |
| WO | 2019/059308 A1 | 3/2019 |

* cited by examiner

QUANTUM DOT, QUANTUM DOT COMPOSITION, WAVELENGTH CONVERSION MATERIAL, WAVELENGTH CONVERSION FILM, BACKLIGHT UNIT AND IMAGE DISPLAY DEVICE

TECHNICAL FIELD

The present invention relates to a quantum dot, a quantum dot composition, a wavelength conversion material, a wavelength conversion film, a backlight unit, and an image display device.

BACKGROUND ART

Semiconductor crystal particles with nanosized particle diameters are called quantum dots, and excitons generated upon light absorption are confined in nanosized region, so that energy level of the semiconductor crystal particles become discrete. Further, band gap changes depending on the particle diameter. Due to these effects, the fluorescence emission by quantum dots is brighter and more efficient than those by common fluorescent materials and exhibits sharp light emission. Moreover, based on such nature that the band gap varies depending on the particle diameter, quantum dots are characterized in that the emission wavelength is controllable and are expected to be applied as a wavelength conversion material for solid-state lighting and displays. For example, by using quantum dots as a wavelength conversion material in a display, it is possible to realize a wider color range and lower power consumption than conventional fluorescent materials.

There is proposed a method for assembling quantum dots for use as a wavelength conversion material, in which quantum dots are dispersed in a resin material and a resin material containing the quantum dots is laminated with a transparent film, then the laminated film is incorporated into a backlight unit as a wavelength conversion film (Patent Document 1).

CITATION LIST

Patent Literature

Patent Document 1: JP 2013-544018 T
Patent Document 2: WO 2011-081037
Patent Document 3: Japanese Patent No. 5900720
Patent Document 4: JP 2018-109141

SUMMARY OF INVENTION

Technical Problem

However, since quantum dots have small particle size of nanometer size, they have large specific surface area. Therefore, since surface energy is high and the surface activity is high, it is easy to be destabilized. Surface defects are likely to generate due to dangling bonds and oxidation reactions on the surface of quantum dots, which causes deterioration of fluorescence emission characteristics. These are particularly prominent problems with cadmium-free quantum dots and perovskite type quantum dots. It is known that currently obtained quantum dots have such stability problems and cause deterioration of luminous properties due to heat, humidity, photoexcitation, or the like. The stability of quantum dots is an important issue because changes over time in the luminous properties of quantum dots cause defects such as color unevenness, emission unevenness, and missing dots when used in a display.

To solve such problems, methods to improve the stability of the quantum dots are studied by coating the surface of the quantum dots with a polymer or an inorganic oxide (Patent Document 2), or by using a gas barrier film having low oxygen and/or humidity permeability (Patent Document 3).

However, in the step of coating the surface of the quantum dots in order to improve such stability, there is a problem that it is not possible to maintain the luminous properties of the quantum dots and their characteristics deteriorate. Further, the stabilization by the barrier film also has a problem that deterioration due to diffusion of oxygen and water vapor from the edge face of the film progresses. Further, in mobile applications such as tablets and smartphones, it is required to make the wavelength conversion film thinner. Generally, the barrier film has a thickness of about 20 to 200 µm, thus the thickness becomes at least 40 µm or more in order to protect both sides of the film, there is a limit to reducing the thickness of the wavelength conversion film. In addition, since the amount of excitation light converted decreases as the film becomes thinner, it becomes necessary to increase the content of quantum dots contained in the wavelength conversion film in order to compensate for this. An increase in the quantum dot concentration in the quantum dot composition lowers the dispersibility of the quantum dots, makes it easier for agglomeration to occur, and causes problems such as precipitation of the quantum dots in the filming process.

Further, a method of directly converting blue excitation light into green and red has been proposed not as a wavelength conversion film but as a color filter (Patent Document 4). When quantum dots are used as the color filter, it is not possible to use a barrier film or the like as in the wavelength conversion film described above, and deterioration of the luminous properties of the quantum dots due to the curing of the quantum dot composition, the subsequent manufacturing process, and long-term use becomes an important issue. Further, in this method, unlike the case where the film is used as a wavelength conversion film, it is required to suppress the transmission of blue light, which is the excitation light that causes a decrease in the color rendering index (CRI) of the display. For this purpose, it is necessary to increase the concentration of the quantum dot particles in the quantum dot composition. However, when the concentration of the quantum dots in the quantum dot composition is increased, agglomeration occurs, which causes problems of emission wavelength shift, luminous efficiency degradation, and emission non-uniformity.

Fluororesin has excellent properties such as water resistance and heat resistance etc., but it has a problem of low compatibility with other materials, and there is a problem that quantum dot agglomeration is likely to occur when the concentration of the quantum dots added to the fluororesin is increased.

The present invention has been made to solve the above problems, and an object of the present invention is to provide quantum dots comprising fluorescent crystalline nanoparticle having high dispersibility and stability and less likely to agglomerate even when added to a fluororesin.

Solution to Problem

The present invention has been made to achieve the above object, and provides a quantum dot comprising fluorescent crystalline nanoparticle, wherein surface of the quantum dot is modified with a ligand containing fluorine.

According to such a quantum dot, it has high stability and is less likely to agglomerate when added to a fluororesin.

At this time, the fluorine-containing ligand may contain at least one compound selected from a fluorine-containing silane coupling agent, a fluorine-containing siloxane polymer, a perfluoropolyether, and a fluorine-containing acrylate.

As a result, agglomeration when added to the fluororesin is less likely to occur.

At this time, the quantum dot composition containing the quantum dots and the fluororesin can be obtained.

As a result, the quantum dot composition has high stability, high dispersibility, and is less likely to cause agglomeration of quantum dots.

At this time, the fluororesin can be at least one selected from a fluoropolymer, a fluorine-containing cyclic compound, and a fluorine containing copolymer.

Further, the quantum dot composition can have the fluororesin at least one structural unit selected from the following general formulas (1) to (7).

$$(-CF_2-CF_2-) \quad (1)$$

$$(-CF_2-CF\ (O-R)-) \quad (2)$$

here R is a perfluoroalkyl group $$(-CF_2-CFCl-) \quad (3)$$

$$(-CF_2-CF\ (CF_3)-) \quad (4)$$

$$(-CH_2-CF_2-) \quad (5)$$

$$(-CH_2-CHF-) \quad (6)$$

(7)

Further, the quantum dot composition can have the fluororesin being a copolymer having at least one structural unit selected from the general formulas (1) to (7), and the copolymer is one of a block copolymer, an alternating copolymer, random copolymer, or a graft copolymer.

Further, the quantum dot composition can have the fluororesin being a polymer selected from polytetrafluoroethylene, perfluoroalkoxyalkane, polyvinylidene fluoride, polyvinylfluoride, tetrafluoroethylene/ethylene copolymer, tetrafluoroethylene/perfluoroalkoxyethylene copolymer, tetrafluoroethylene/perfluoropropylene copolymer, tetrafluoroethylene/perfluoroalkyl vinyl ether copolymer, fluoroethylene/vinyl ether copolymer, polychlorotrifluoroethylene, chlorotrifluoroethylene/ethylene copolymer, fluoroolefin/acrylic acid ester copolymer and tetrafluoroethylene/perfluorodioxol copolymer or derivatives thereof.

This results in a quantum dot composition that is more stable and less likely to cause quantum dot agglomeration.

At this time, the quantum dot composition further contains a fluorine-free resin can be obtained, and more preferably, the fluorine-free resin can be at least one resin selected from an acrylic resin, an epoxy resin, a silicone resin, a urethane resin, and a polyimide resin.

This makes it easy to set the characteristics of the molded product using the quantum dot composition, and the range of application becomes wider.

At this time, it can be obtained as a wavelength conversion material which is a cured product of the quantum dot composition, and further, a wavelength conversion film including a wavelength conversion layer made of the wavelength conversion material can be obtained.

As a result, the agglomeration of quantum dots in the material is suppressed, and the wavelength conversion material and the wavelength conversion film having excellent stability are obtained.

At this time, the wavelength conversion film may be such that the fluororesin and the fluororesin-free resin are at least partially phase separated.

As a result, the coatability can be improved, such as the improvement of the adhesion when the resin processed product is coated, and cost can be reduced by reducing the amount of the fluororesin-containing resin used.

Further, the wavelength conversion film may be composed of the single layer wavelength conversion layer.

As a result, the thickness of the wavelength conversion film can be made thinner, which makes it particularly suitable for mobile applications or the like.

On the other hand, the wavelength conversion film may have a structure in which transparent films are laminated on both sides of the wavelength conversion layer.

As a result, the strength is improved, the surface is protected, the light is diffused, or the like.

Further, a backlight unit having the wavelength conversion film is provided.

As a result, the backlight unit has stable luminous properties.

At this time, a color filter comprising the quantum dot composition is provided, wherein the quantum dot composition is patterned as a quantum dot composition having a light emitting center in a wavelength range of 420 nm to 470 nm and a quantum dot composition having a light emitting center in a wavelength range of 600 nm to 660 nm in each pixel portion.

As a result, the color filter has excellent stability of luminous properties.

Further, the image display device having the wavelength conversion film can be provided.

As a result, the image display device has stable luminous properties.

Advantageous Effects of Invention

As described above, according to the quantum dots of the present invention, a wavelength conversion material with excellent stability can be provided since the quantum dots have high stability, and even when added to a fluororesin, agglomeration is unlikely to occur (high dispersibility).

DESCRIPTION OF EMBODIMENTS

Hereinafter, the present invention will be described in detail, but the present invention is not limited thereto.

As described above, when a wavelength conversion material containing high concentration quantum dots is used, it has been required to improve the dispersibility in the fluororesin and the reliability as the wavelength conversion material.

As a result of diligent studies on the above-mentioned problems, the present inventors have obtained quantum dot comprising fluorescent crystalline nanoparticle, wherein surface of the quantum dot is modified with a fluorine-containing ligand, and the present invention has been completed by finding that the quantum dot has high stability and is less likely to cause agglomeration even when added to a fluororesin.

(Quantum Dot)

The quantum dot according to the present invention contains a ligand containing fluorine on its surface, and the ligand is not particularly limited and can be appropriately selected depending on the intended purpose. The ligand may be one type, or a plurality of two or more types of ligands may be mixed. The content of the fluorine atom in the ligand is not particularly limited and can be appropriately set according to the purpose.

As the compound as a ligand, a fluorine-containing silane coupling agent, a fluorine-containing siloxane polymer, a perfluoropolyether, a fluorine-containing acrylate and the like are preferable. Examples of fluorine-containing silane coupling agents include 1,1,1-trifluoro-3-[dimethoxy (methyl) silyl] propane, pentafluorophenylethoxydimethylsilane, triethoxy-1H, 1H, 2H, 2H-tridecafluoro-n-octylsilane, trimethoxy (3,3,3-trifluoropropyl) silane, triethoxy (1H, 1H, 2H, 2H-nonafluorohexyl) silane, triethoxy-1H, 1H, 2H, 2H-heptadecafluorodecylsilane, trimethoxy (1H, 1H, 2H, 2H-heptadecafluorodecyl) silane, trimethoxy (1H, 1H, 2H, 2H-nonafluorohexyl) silane, triethoxy (pentafluorophenyl) silane, trimethoxy (11-pentafluorophenoxyundecyl)) silane, triethoxy (pentafluorophenyl) silane, triethoxy [5,5,6,6,7,7,7-heptafluoro-4,4-bis (trifluoromethyl) heptyl] silane, trimethoxy (pentafluorophenyl) silane and trimethoxy (1H, 1H, 2H, 2H-tridecafluoro-n-octyl) silane. Examples of the fluorine-containing siloxane polymer include KP-911 (manufactured by Shin-Etsu Chemical Co., Ltd.). Examples of the perfluoropolyether include Fluorolink F10, Fluorolink S10, Fluorolink AD1700, and Fluorolink MD700 (manufactured by Solvay Specialty Polymers). Examples of the fluorine-containing acrylate include Viscoat 3F, Viscoat 4F, Viscoat 8F, Viscoat 8FM, and Viscoat 13F (manufactured by Osaka Organic Chemical Industry Ltd.).

Further, in the present invention, the structure, composition, manufacturing method, etc. of the quantum dots are not particularly limited, and the structure, composition, manufacturing method, etc. can be selected according to the desired characteristics.

The quantum dots may have only a core or a core-shell structure. Further, the particle size of the quantum dots can be appropriately selected according to the target wavelength range.

The composition of the quantum dots includes II-IV group semiconductors, III-V group semiconductors, II-VI group semiconductors, group semiconductors, II-IV-V group semiconductors, IV group semiconductors, perovskite type semiconductors, and the like. Specifically, CdSe, CdS, CdTe, InP, InAs, InSb, AlP, AlAs, AlSb, ZnSe, ZnS, ZnTe, $Zn_3P_2$, GaP, GaAs, GaSb, $CuInSe_2$, $CuInS_2$, $CuInTe_2$, $CuGaSe_2$, CuGaS2, $CuGaTe_2$, $CuAlSe_2$, $CuAlS_2$, $CuAlTe_2$, $AgInSe_2$, $AgInS_2$, AgInTe, $AgGaSe_2$, $AgGaS_2$, $AgGaTe_2$, PbSe, PbS, PbTe, Si, Ge, graphene, $CsPbCl_3$, $CsPbBr_3$, $CsPbI_3$, $CH_3NH_3PbCl_3$, and mixed crystals thereof or those added with a dopant are exemplified.

Further, the surface of the quantum dot may have a coating layer of an organic molecule, an inorganic molecule or a polymer, and the structure thereof is not limited. When the coating layer is provided, the thickness thereof can be appropriately selected according to the purpose. The thickness of the coating layer is not particularly limited, but when the particle size of the quantum dots is 100 nm or less, the decrease in dispersibility can be further suppressed, and as a result, the decrease in light transmittance and the agglomeration can be further suppressed. The thickness is preferably such that the particle size is 100 nm or less.

As the coating layer, organic molecules such as stearic acid, oleic acid, palmitic acid, dimercaptosuccinic acid, oleylamine, hexadecylamine, octadecylamine, and 1-dodecanethiol, or polymers such as polyvinyl alcohol, polyvinylpyrrolidone, polysilsesquioxane, and poly (methyl methacrylate), polyacrylonitrile, polyethylene glycol, and inorganic molecules such as silica, alumina, titania, zirconia, zinc oxide, gallium oxide, silicon nitride, and gallium nitride are exemplified.

Further, the shape of the quantum dot is not limited, and may be spherical, cubic or rod-shaped, and can be freely selected. The average particle size of the quantum dots is preferably 20 nm or less. When the average particle size is in such a range, the quantum size effect can be stably obtained, the significant decrease in luminous efficiency can be effectively suppressed, and the band gap can be more stably controlled by the particle size. Note that the particle size of the quantum dots can be calculated from average value of maximum diameters in predetermined direction, that is, Feret diameter, of 20 or more particles, by measuring a particle image obtained by a transmission electron microscope (TEM). Of course, the method for measuring the average particle size is not limited to this, and other methods can be used for the measurement.

(Quantum Dot Composition)

The quantum dot composition according to the present invention contains quantum dots whose surface is modified with a ligand containing fluorine and a fluororesin, and the fluororesin is preferably has at least one component selected from a fluoropolymer, a fluorine-containing cyclic compound or a fluorine containing copolymer. This results in a quantum dot composition that is more stable and less likely to cause quantum dot agglomeration.

The degree of polymerization of the fluoropolymer, the fluorine containing cyclic compound, or the fluorine containing copolymer is not particularly limited, and is appropriately selected according to the desired properties such as viscosity and hardness.

The abundance ratio of the fluoropolymer, the fluorine containing cyclic compound, or the fluorine containing copolymer is not particularly limited and can be freely selected according to the desired properties.

The fluoropolymer, the fluorine containing cyclic compound, or the fluorine containing copolymer preferably has at least one structural unit selected from the following general formulas (1) to (7).

(1)

(2)

here

R is a perfluoroalkyl group

(3)

(4)

$$(\text{---}CH_2\text{---}CF_2\text{---}) \quad (5)$$

$$(\text{---}CH_2\text{---}CHF\text{---}) \quad (6)$$

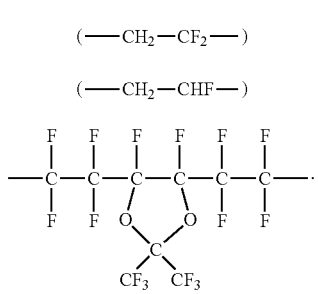
(7)

The abundance ratio of the structural units of the above general formulas (1) to (7) in the fluororesin is not particularly limited, and can be freely selected according to the target resin characteristics.

Further, structural units other than the structural units of the above general formulas (1) to (7) may be included, and the type thereof is not particularly limited and can be appropriately selected according to the characteristics of the target fluororesin. As structural units other than the structural units of the above general formulas (1) to (7), vinyl alcohol, vinyl ether, vinyl ester, acrylic acid ester, methacrylic acid ester, acrylamide, urethane, styrene, ethylene, vinyl acetate, vinyl halide, vinylidene halide, acrylonitrile, vinyl alkyl ether, organo-siloxane and the like are exemplified.

The structure of the fluorine containing copolymer is preferably a block copolymer, an alternating copolymer, a random copolymer, or a graft copolymer.

As the fluoropolymer, the fluorine containing cyclic compound or the fluorine containing copolymer, it is preferably used from the viewpoint of gas barrier properties, processability, and so on, such polymers can be selected from polytetrafluoroethylene, perfluoroalkoxyalkane, polyvinylidene fluoride, polyvinyl fluoride, tetrafluoroethylene/ethylene copolymer (ETFE), tetrafluoroethylene/perfluoroalkoxyethylene copolymer (PFA), tetrafluoroethylene/perfluoropropylene copolymer, tetrafluoroethylene/perfluoroalkyl vinyl ether copolymer, fluoroethylene/vinyl ether copolymer, polychlorotrifluoroethylene (PCTFE), chlorotrifluoroethylene/ethylene copolymer, fluoroolefin/acrylic acid ester copolymer, tetrafluoroethylene/perfluorodioxol copolymer and these derivatives.

The concentration of the quantum dots contained in the quantum dot composition is not particularly limited, and is appropriately adjusted according to the film thickness, the luminous efficiency of the quantum dots, and the characteristics of the target wavelength conversion film.

Further, the quantum dot composition may further contain a fluorine-free resin. Examples of the fluorine-free resin include acrylic resin, epoxy resin etc., silicone resin, urethane resin, and polyimide resin, and one or more of these fluorine-free resins can be included. By using the quantum dot composition containing the fluorine-free resin, it becomes easy to set the characteristics of the molded product, and the range of application is widened.

Further, the quantum dot composition may contain a substance other than the quantum dots, and may contain fine particles such as silica, zirconia, alumina, and titania etc. as a light scatterer, and an inorganic fluorescent or an organic fluorescent may be contained. Examples of the inorganic fluorescent include YAG, LSN, LYSN, CASN, SCASN, KSF, CSO, β-SIALON, GYAG, LuAG and SBCA, and examples of the organic fluorescent include perylene derivative, anthraquinone derivative, anthracene derivative, phthalocyanine derivative, cyanine derivative, dioxazine derivative, benzooxadinone derivative, coumarin derivative, quinophthalone derivative, benzoxazole derivative, and pyrarizone derivative etc.

The method of mixing the quantum dots and the fluororesin is not particularly limited, and can be appropriately selected according to the properties of the fluororesin to be used and the characteristics of the target wavelength conversion film. A solution in which quantum dots are dispersed may be mixed with a fluororesin dissolved in a solvent. The quantum dot solution or the solid quantum dots recovered from the quantum dot solution by centrifugation or the like may be added to the fluororesin flakes and kneaded. The quantum dots and the fluororesin do not necessarily have to be uniformly dispersed, and may be partially phase-separated within a range in which the luminous uniformity of the wavelength conversion film is maintained. In this case, it is possible to improve the coatability such as the improvement of the wettability and the adhesiveness when the resin composition is applied, and it is expected that the cost can be reduced by reducing the amount of the fluororesin used.

(Wavelength Conversion Material)

The wavelength conversion material according to the present invention is a cured product of a quantum dot composition containing quantum dots whose surface are modified with a ligand containing fluorine and a fluororesin.

An example of application of the wavelength conversion material according to the present invention is a wavelength conversion film including a wavelength conversion layer made of a wavelength conversion material obtained by curing the quantum dot composition. The thickness of the wavelength conversion film is not particularly limited and can be appropriately selected depending on the intended purpose. The thickness of the wavelength conversion film is preferably 5 to 500 µm or less, more preferably 200 µm or less, and particularly preferably 100 µm or less. If the wavelength conversion film has a thickness of 5 µm or more, more stable luminous properties can be obtained.

The structure of the wavelength conversion film is not particularly limited, and may be a laminated structure in which a wavelength conversion layer made of a wavelength conversion material which is a cured product of the quantum dot composition is sandwiched between transparent films, or it may have a two-layer structure in which a wavelength conversion layer is applied on the transparent film as a base material. If the laminated structure is used, functions such as improvement of strength, surface protection, and light diffusion can be imparted. The transparent film is not particularly limited and can be appropriately selected. Examples of the transparent film include PET, PP and PE etc. An adhesive layer may be present between the transparent film and the wavelength conversion layer. Further, a wavelength conversion film and another type of film such as a light diffusing film etc. may be used in combination. In order to improve the adhesion between the wavelength conversion layer and the light diffusion film, the surface of the film and the surface of the wavelength conversion layer may be treated with a silane coupling agent or the like.

Further, the wavelength conversion film may be a single-layer film composed of only the wavelength conversion layer. If it is a single-layer film, the thickness of the film can be made thinner, which makes it particularly suitable for mobile applications etc.

The method for producing the wavelength conversion film is not particularly limited, and can be appropriately selected according to the properties of the quantum dot composition and the characteristics of the target wavelength conversion film. Examples of the method for producing the wavelength conversion film include a solution casting method, a solution flow method, and a melt extrusion molding method etc.

As one of the embodiments of the present invention, there is provided a backlight unit in which a wavelength conversion film is installed on a light guide panel surface to which a blue LED is coupled. Further, as one of the other embodiments, the wavelength conversion film provides an image display device arranged between a light guide panel surface to which a blue LED is coupled and a liquid crystal display panel. In these embodiments, the wavelength conversion film absorbs at least a part of the blue light of the primary light which is the light source and emits the secondary light having a wavelength longer than that of the primary light, thus converting to light with an arbitrary wavelength distribution depending on the emission wavelength of the quantum dot. This makes it possible to provide a backlight unit and an image display device having excellent stability of luminous properties.

Further, in the wavelength conversion film, the fluororesin and the fluorine-free resin may be phase-separated at least partially. With such a wavelength conversion film, it is possible to improve the coatability such as the improvement of the adhesion etc. when the resin processed product is applied, and it is possible to reduce the cost by reducing the amount of the fluororesin used.

As one of the other embodiments of the present invention, a color filter using the quantum dot composition is provided. The structure of the color filter is the same as that of the conventional color filter. A color filter can be formed by patterning and curing a quantum dot composition having light emission in a wavelength range of 420 nm to 470 nm, and that having a wavelength range of 600 nm to 660 nm, and a resin composition containing a light scatterer according to each pixel on a glass substrate or a transparent film on which a black matrix is formed. This makes it possible to provide a color filter having excellent stability of luminous properties. Note that the patterning method of the quantum dot composition is not particularly limited, and examples thereof include an inkjet method, an offset printing method, and a screen printing method.

Next, a method for manufacturing a wavelength conversion material using quantum dots according to the present invention will be described with reference to specific examples. Note that the method for producing the wavelength conversion film and the color filter is not particularly limited, and can be appropriately selected depending on the intended purpose.

EXAMPLE

Hereinafter, the present invention will be described in more detail with reference to Examples and Comparative Examples of the present invention, but the present invention is not limited thereto.

As the quantum dots, spherical InP/ZnSe/ZnS core-shell quantum dots (QD-G) having particle diameter of 6 nm and spherical InP/ZnSe/ZnS core-shell quantum dots (QD-R) having particle diameter of 8 nm were used. These two types of quantum dots were mixed and dispersed in hexane to obtain a quantum dot solution in which the quantum dots were 20% by mass of a hexane solution.

Next, in order to prepare the quantum dots used in the examples, the surface treatments of the quantum dots were performed by the following methods (1), (2), (3), and (4).
(1) To the above-mentioned quantum dot solution, triethoxy-1H, 1H, 2H, 2H-tridecafluoro-n-octylsilane was added so as to be 10% by mass with respect to the quantum dots, and the mixture was heated to 50° C. and stirred for 24 hours. To this solution, 5 times the volume ratio of acetone was added to precipitate quantum dots, and the solution was treated with a centrifuge at 10000 rpm for 10 minutes. Quantum dots surface treated with triethoxy-1H, 1H, 2H, 2H-tridecafluoro-n-octylsilane were recovered.
(2) KP-911 was added to the above-mentioned quantum dot solution so as to be 15% by mass with respect to the quantum dots, and the mixture was heated to 50° C. and stirred for 24 hours. The solvent was removed from this solution under reduced pressure, and quantum dots whose surface was treated with a fluorine-containing siloxane polymer were recovered.
(3) Fluorolink AD1700 was added to the above-mentioned quantum dot solution so as to be 15% by mass with respect to the quantum dots, and the mixture was heated to 50° C. and stirred for 24 hours. The solvent was removed from this solution under reduced pressure, and quantum dots whose surface was treated with perfluoropolyether were recovered.
(4) Viscoat 8F was added to the above-mentioned quantum dot solution so as to be 15% by mass with respect to the quantum dots, and the mixture was heated to 50° C. and stirred for 24 hours. The solvent was removed from this solution under reduced pressure, and quantum dots whose surface was treated with fluorine-containing acrylate were recovered.

Using the quantum dots whose surfaces were modified as described in (1), (2), (3), and (4) above, wavelength conversion materials were prepared by the following procedures. Further, in the same procedure at this time, the three-level quantum dot compositions are adjusted so that the concentrations of the quantum dots contained in the quantum dot composition are 5% by mass, 10% by mass, and 15% by mass, respectively, then wavelength conversion materials were prepared.

Example 1

To ETFE (C-88AXP manufactured by AGC Inc.) as a fluororesin, quantum dots QD-G and QD-R, which were obtained by separately performing the surface modification treatments (1) to (4) above were added so as to have a predetermined concentration. After being put into a single-screw extruder and kneaded, it was passed through a T-type die and an extrusion roll under the condition of 300° C., then cooled and solidified to form a film. The thickness of the obtained film was measured and found to be 71 μm.

Example 2

To PFA (Neoflon PFA AP-202 manufactured by Daikin Industries, Ltd.) as a fluororesin, quantum dots obtained by separately performing the surface modification treatments (1) to (4) above were added so as to have a predetermined concentration. After being put into a single-screw extruder and kneaded, it was passed through a T-type die and an extrusion roll under the condition of 320° C., then cooled and solidified to form a film. The thickness of the obtained film was measured and found to be 84 μm.

Example 3

To PCTFE (Neoflon PCTFE M-300P manufactured by Daikin Industries, Ltd.) as a fluororesin, quantum dots obtained by separately performing the surface modification treatments (1) to (4) above were added so as to have a predetermined concentration. After being put into a single-screw extruder and kneaded, it was passed through a T-type die and an extrusion roll under the condition of 290° C., then cooled and solidified to form a film. The thickness of the obtained film was measured and found to be 110 μm.

Example 4

To polyvinylidene fluoride resin (KYNAR740 manufactured by Arkema Co., Ltd.) as a fluororesin, quantum dots obtained by separately performing the surface modification treatments (1) to (4) above were added so as to have a predetermined concentration. After being put into a single-screw extruder and kneaded, it was passed through a T-shaped die and an extrusion roll under the condition of 220° C., then cooled and solidified to form a film. The thickness of the obtained film was measured and found to be 46 μm.

Example 5

Polyvinylidene fluoride resin (KYNAR740 manufactured by Arkema Co., Ltd.) as a fluororesin was dissolved in DMF (manufactured by Kanto Chemical Co., Inc.) as a solvent so that the solid content concentration was 20% by mass. To this resin solution, quantum dots obtained by separately performing the surface modification treatments (1) to (4) above were added to the resin component so that the quantum dots had a predetermined concentration to the resin components, and mixed to form a quantum dot composition, thus mixed solution containing the substance was obtained. This mixed solution is stirred and defoamed, applied on a 25 μm PET film (Lumirror film T60 manufactured by Toray Industries, Inc.) with a bar coater, and heated in an oven at 80° C. for 30 minutes to solidify to form a film containing a wavelength conversion layer. Further, a PET film was laminated on the wavelength conversion layer and laminated. The film was heated at 85° C. for 1 hour to cure the wavelength conversion layer. When the thickness of the obtained film was measured, the thickness of the wavelength conversion layer was 108 μm, and that of the wavelength conversion film was 158 μm.

Example 6

Quantum dots obtained by separately performing the surface modification treatments (1) to (4) above were added into a 40% xylene solution of a fluoroethylene/vinyl ether copolymer (Lumiflon LF200 manufactured by AGC Inc.), which was a fluororesin, to a predetermined concentration to the resin solid content to obtain a mixed solution containing the quantum dot composition. The mixed solution containing this quantum dot composition was stirred and defoamed, applied on a 25 μm PET film (Lumirror film T60 manufactured by Toray Industries, Inc.) with a bar coater, and heated in an oven at 80° C. for 60 minutes to solidify to form a film. When the thickness of the obtained film was measured, the thickness of the wavelength conversion layer was 70 μm, and that of the wavelength conversion film was 95 μm.

Example 7

Quantum dots obtained by separately performing the surface modification treatments (1) to (4) above were added into a 40% xylene solution of a fluoroethylene/vinyl ether copolymer (Lumiflon LF200 manufactured by AGC Inc.), which was a fluororesin, to a predetermined concentration to the resin solid content to obtain a mixed solution containing the quantum dot composition. Further, silica particles having an average particle size of 30 μm (QSG-30 manufacture by Shin-Etsu Chemical Co., Ltd.) were added to the mixed solution in an amount of 5% by mass based on the solution amount of the mixed solution and dispersed. The mixed solution containing the silica particles was defoamed by stirring, coated on a 25 μm PET film (Toray Industries, Inc. Lumirror film T60) with a bar coater, and heated in an oven at 80° C. for 60 minutes to solidify to form a film. When the thickness of the obtained film was measured, the thickness of the wavelength conversion layer was 77 μm, and that of the wavelength conversion film was 102 μm.

Example 8

Quantum dots obtained by separately performing the surface modification treatments (1) to (4) above were added into a 40% xylene solution of a fluoroethylene/vinyl ether copolymer (Lumiflon LF200 manufactured by AGC Inc.), which is a fluororesin, to a predetermined concentration to the resin solid content to obtain a mixed solution containing the quantum dot composition. Acrylic resin (ACRYDIC BL-616-BA manufactured by DIC Corporation) was added to this mixed solution so that the mass ratio of fluororesin to acrylic resin was 3:7, and the mixture was stirred. The mixed solution containing the quantum dots, the fluororesin, and the acrylic resin was defoamed by stirring, applied on a 25 μm PET film with a bar coater, and heated in an oven at 80° C. for 60 minutes to solidify to form a film. When the thickness of the obtained film was measured, the thickness of the wavelength conversion layer was 83 μm, and that of the wavelength conversion film was 108 μm.

Example 9

The above-mentioned quantum dots (QD-G) and (QD-R) were not mixed, and (QD-G) and (QD-R) were separately performed the above mentioned treatment (1), (2), (3), and (4), thus surface-treated quantum dots (QD-G) and (QD-R) were individually prepared. These surface-treated quantum dots (QD-G) and (QD-R) were added to a 40% xylene solution of a fluoroethylene/vinyl ether copolymer (Lumiflon LF200 manufactured by AGC Inc.), which is a fluororesin, respectively, to a predetermined concentration to obtain a mixed solution containing the quantum dot composition. Regarding the mixed solution applied to the blue pixel portion of the color filter, silica particles (QSG-30 manufactured by Shin-Etsu Chemical Co., Ltd.) having an average particle size of 30 μm with respect to the amount of the xylene solution of the fluoroethylene/vinyl ether copolymer not containing the quantum dot composition, were added in an amount of 15% by mass and dispersed to prepare a mixed solution. An inkjet device (LaboJet-600 manufactured by Microjet Corporation) was used to form resin layers for the red, green, and blue pixel portions of these mixed solutions on a glass substrate on which a black matrix was formed so that the pixel portions were 30 μm square. The resin layers were then heat-treated at 80° C. for 60 minutes to cure. The thickness of the wavelength conversion layer of the obtained color filter was 9 μm.

Comparative Example 1

Quantum dots QD-G and QD-R which were not surface-treated were added to an acrylic resin (ACRYDIC BL-616-

BA manufactured by DIC Corporation) so that the quantum dots had a predetermined concentration with respect to the resin solid content, then, mixed and stirred to obtain a mixed solution containing the quantum dot composition. This mixed solution was stirred and defoamed, applied on a 25 µm PET film with a bar coater, heated at 60° C. for 2 hours, and then heated at 150° C. for 4 hours to solidify to form a film. Further, a 25 µm PET film was laminated on the resin layer and laminated. The film was heated at 85° C. for 1 hour to cure the resin layer. When the thickness of the obtained film was measured, the thickness of the wavelength conversion layer was 84 µm, and that of the wavelength conversion film was 134 µm.

Comparative Example 2

Quantum dot solutions QD-G and QD-R which were not been surface-treated were added to an epoxy resin (EpiFine TO-0107-20 manufactured by Fine Polymers Corporation) so that the quantum dots had a predetermined concentration with respect to the resin solid content, then the mixture was stirred to obtain a mixed solution containing the quantum dot composition. This mixed solution was defoamed by stirring, applied on a 25 µm PET film with a bar coater, and further attached with a 25 µm PET film. This was irradiated with UV at 100 W/cm$^2$ for 20 seconds with a 365 nm UV LED lamp and cured to form a film. When the thickness of the obtained film was measured, the thickness of the wavelength conversion layer was 67 µm, and that of the wavelength conversion film was 117 µm.

Comparative Example 3

Quantum dot solutions QD-G and QD-R which were not surface-treated were added to an acrylic resin (ACRYDIC BL-616-BA manufactured by DIC Corporation) so that the quantum dots had a predetermined concentration with respect to the resin solid content, then stirred to obtain a mixed solution containing the quantum dot composition. This mixed solution was stirred and defoamed, applied on a 15 µm barrier film (GL film manufactured by Toppan Inc.) with a bar coater, heated at 60° C. for 2 hours, and then heated at 150° C. for 4 hours to solidify and form a film. Further, a 15 µm barrier film was laminated on the resin layer and laminated. The film was heated at 85° C. for 1 hour to cure the resin layer. When the thickness of the obtained film was measured, the thickness of the wavelength conversion layer was 83 µm, and that of the wavelength conversion film was 113 µm.

Comparative Example 4

0.2 mL of 3-aminopropyltrimethoxysilane (manufactured by Tokyo Chemical Industry Co., Ltd.) was added to 20 mL each of the quantum dot solutions QD-G and QD-R that had not been surface-treated, and mixed at room temperature for 24 hours. To the quantum dot solution thus treated with this 3-aminopropyltrimethoxysilane, 0.5 mL of tetramethoxysilane (manufactured by Tokyo Chemical Industry Co., Ltd.) was added dropwise with vigorous stirring. While stirring, 1 mL of 10% aqueous ammonia was added dropwise, and the mixture was stirred for 20 hours. After the reaction, the quantum dots having the SiO$_2$ layer were obtained by centrifugation. Quantum dots QD-G and QD-R having the obtained SiO$_2$ layer were added to an acrylic resin (ACRYDIC BL-616-BA manufactured by DIC Corporation) so that the quantum dots had a predetermined concentration with respect to the resin solid content, then stirred to obtain a mixed solution containing a quantum dot composition having a SiO$_2$ coating layer. This mixed solution was stirred and defoamed, applied on a 25 µm PET film with a bar coater, heated at 60° C. for 2 hours, and then heated at 150° C. for 4 hours to solidify to form a film. Further, a 25 µm PET film was laminated on the resin layer and laminated. The film was heated at 85° C. for 1 hour to cure the resin layer. When the thickness of the obtained film was measured, the thickness of the wavelength conversion layer was 72 µm, and that of the wavelength conversion film was 122 µm.

Comparative Example 5

Each of quantum dots (QD-G) and (QD-R) which were not surface-treated were added to a 40% xylene solution of a fluoroethylene/vinyl ether copolymer (Lumiflon LF200 manufactured by AGC Inc.) to a predetermined concentration to obtain a mixed solution containing the quantum dot composition. Regarding the mixed solution applied to the blue pixel portion of the color filter, silica particles (QSG-30 manufactured by Shin-Etsu Chemical Co., Ltd.) having an average particle size of 30 µm with respect to the amount of the xylene solution of the fluoroethylene/vinyl ether copolymer not containing the quantum dot composition, were added in an amount of 15% by mass and dispersed to prepare a mixed solution. A resin layer of these mixed solutions was formed on the red, green, and blue pixel portions on the glass substrate on which the black matrix was formed by using an inkjet device (LaboJet-600 manufactured by Microjet) to form a resin layer at 80° C., 60 minutes of heat treatment was performed to cure. The size of the wavelength conversion layer of the obtained color filter was 30 µm square and the thickness was 9 µm.

With respect to the wavelength conversion film and the color filter produced by each of the above methods (Examples and Comparative Examples), the agglomeration state of quantum dots was observed with a fluorescence microscope (IX83, manufactured by Olympus Corporation). If the diameter of the agglomeration of quantum dots is less than 1 µm, it is marked as ○, if it is 1 µm or more and less than 5 µm, it is marked as Δ, and if it is 5 µm or more, it is marked as X. Table 1 shows the evaluation results of the dispersed state of the wavelength conversion materials produced at each quantum dot concentration.

TABLE 1

| Quantum dot concentration | 5% by mass | 10% by mass | 15% by mass |
| --- | --- | --- | --- |
| Example 1 | ○ | ○ | ○ |
| Example 2 | ○ | ○ | ○ |
| Example 3 | ○ | ○ | ○ |
| Example 4 | ○ | ○ | ○ |
| Example 5 | ○ | ○ | ○ |
| Example 6 | ○ | ○ | ○ |
| Example 7 | ○ | ○ | ○ |
| Example 8 | ○ | ○ | ○ |
| Example 9 | ○ | ○ | ○ |
| Comparative Example 1 | ○ | Δ | X |
| Comparative Example 2 | ○ | X | X |
| Comparative Example 3 | ○ | Δ | X |

TABLE 1-continued

| Quantum dot concentration | 5% by mass | 10% by mass | 15% by mass |
|---|---|---|---|
| Comparative Example 4 | Δ | X | X |
| Comparative Example 5 | Δ | X | X |

As shown in Table 1, it is understood that by using quantum dots modified with a fluorine-containing ligand, dispersibility can be maintained even if the quantum dot concentration is increased when the quantum dot composition contains a fluororesin.

Further, the initial luminous properties of the wavelength conversion film produced by the above method were measured. After held in a high temperature and high humidity state (temperature 85° C., humidity 85%, holding time 250 hours), the luminous properties were evaluated again. When the amount of change in the relative intensity of the quantum yield after maintaining the high temperature and high humidity state is less than 5% based on the quantum yield at the time of initial light emission, were evaluated as ⊚, 5% or more and less than 10%, were evaluated as ○, those with 10% or more and less than 20% were evaluated as Δ, and those with 20% or more were evaluated as X, and the comparisons were shown in Table 2. Note that, for the evaluation of these fluorescence emission characteristics, the luminous properties were measured using a quantum efficiency measurement system (QE-2100 manufactured by Otsuka Electronics Co., Ltd.) with an excitation wavelength of 450 nm.

TABLE 2

| Quantum dot concentration | 5% by mass | 10% by mass | 15% by mass |
|---|---|---|---|
| Example 1 | ⊚ | ⊚ | ⊚ |
| Example 2 | ⊚ | ⊚ | ⊚ |
| Example 3 | ⊚ | ⊚ | ⊚ |
| Example 4 | ⊚ | ⊚ | ⊚ |
| Example 5 | ⊚ | ⊚ | ⊚ |
| Example 6 | ⊚ | ⊚ | ⊚ |
| Example 7 | ⊚ | ⊚ | ⊚ |
| Example 8 | ⊚ | ⊚ | ⊚ |
| Example 9 | ⊚ | ⊚ | ⊚ |
| Comparative Example 1 | X | X | X |
| Comparative Example 2 | Δ | X | X |
| Comparative Example 3 | ⊚ | ○ | Δ |
| Comparative Example 4 | ○ | ○ | Δ |
| Comparative Example 5 | X | X | X |

As shown in Table 2, by using the quantum dots modified with the fluorine-containing ligand, it is possible to suppress the agglomeration of the quantum dots in the fluororesin and the deterioration of the quantum dots. It can be seen that a highly reliable wavelength conversion material can be obtained.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A quantum dot comprising fluorescent crystalline nanoparticle, wherein
the quantum dot comprises a fluorescent crystalline nanoparticle and surface of the quantum dot is modified with a ligand containing fluorine, and
the quantum dot composition contains a fluororesin and a fluorine-free resin.

2. The quantum dot according to claim 1, wherein the fluorine-containing ligand contains at least one compound selected from a fluorine-containing silane coupling agent, a fluorine-containing siloxane polymer, a perfluoropolyether, and a fluorine-containing acrylate.

3. The quantum dot composition according to claim 2, wherein the fluororesin is at least one selected from a fluoropolymer, a fluorine-containing cyclic compound, and a fluorine containing copolymer.

4. The quantum dot composition according to claim 1, wherein the fluororesin is at least one selected from a fluoropolymer, a fluorine-containing cyclic compound, and a fluorine containing copolymer.

5. The quantum dot composition according to claim 1, wherein the fluororesin has at least one structural unit selected from the following general formulas (1) to (7):

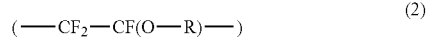

where R is a perfluoroalkyl group

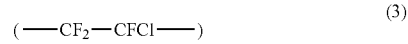

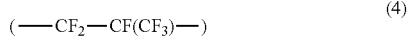

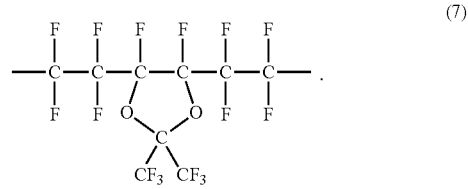

6. The quantum dot composition according to claim 5, wherein the fluororesin is a copolymer having at least one structural unit selected from the general formulas (1) to (7), and the copolymer is one of a block copolymer, an alternating copolymer, a random copolymer or a graft copolymer.

7. The quantum dot composition according to claim 1, wherein the fluororesin is a polymer selected from polytetrafluoroethylene, perfluoroalkoxyalkane, polyvinylidene fluoride, polyvinylfluoride, tetrafluoroethylene/ethylene copolymer, tetrafluoroethylene/perfluoroalkoxyethylene copolymer, tetrafluoroethylene/perfluoropropylene copolymer, tetrafluoroethylene/perfluoroalkyl vinyl ether copolymer, fluoroethylene/vinyl ether copolymer, polychlorotrifluoroethylene, chlorotrifluoroethylene/ethylene copolymer, fluoroolefin/acrylic acid ester copolymer and tetrafluoroethylene/perfluorodioxol copolymer or derivatives thereof.

8. The quantum dot composition according to claim 1, wherein the fluorine-free resin contains at least one resin selected from an acrylic resin, an epoxy resin, a silicone resin, a urethane resin, and a polyimide resin.

9. A wavelength conversion material comprising a cured product of the quantum dot composition according to claim 1.

10. A wavelength conversion film comprising a wavelength conversion layer made of the wavelength conversion material according to claim 9.

11. The wavelength conversion film according to claim 10, wherein the wavelength conversion film is composed of a single layer of the wavelength conversion layer.

12. The wavelength conversion film according to claim 10, wherein the wavelength conversion film has a structure in which transparent films are laminated on both sides of the wavelength conversion layer.

13. A wavelength conversion film comprising a wavelength conversion layer made of a wavelength conversion material which is a cured product of the quantum dot composition according to claim 1, wherein the fluororesin and the fluorine-free resin are at least partially phase separated with each other.

14. A backlight unit comprising the wavelength conversion film according to claim 10.

15. An image display device comprising the wavelength conversion film according to claim 10.

16. A color filter comprising a quantum dot composition, wherein
the quantum dot composition contains a quantum dot and a fluororesin wherein,
the quantum dot comprises a fluorescent crystalline nanoparticle and surface of the quantum dot is modified with a ligand containing fluorine, and
the quantum dot composition is patterned as a quantum dot composition having a light emitting center in a wavelength range of 420 nm to 470 nm and a quantum dot composition having a light emitting center in a wavelength range of 600 nm to 660 nm in each pixel portion.

* * * * *